United States Patent
Tsai et al.

(10) Patent No.: US 10,998,061 B1
(45) Date of Patent: May 4, 2021

(54) MEMORY SYSTEM AND MEMORY ACCESS INTERFACE DEVICE THEREOF

(71) Applicant: REALTEK SEMICONDUCTOR CORPORATION, Hsinchu (TW)

(72) Inventors: Fu-Chin Tsai, Hsinchu (TW);
Chun-Chi Yu, Hsinchu (TW);
Chih-Wei Chang, Hsinchu (TW);
Gerchih Chou, San Jose, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/874,958

(22) Filed: May 15, 2020

(51) Int. Cl.
*G11C 7/00* (2006.01)
*G11C 16/32* (2006.01)
*G11C 16/26* (2006.01)
*G11C 16/04* (2006.01)

(52) U.S. Cl.
CPC .......... *G11C 16/32* (2013.01); *G11C 16/0483* (2013.01); *G11C 16/26* (2013.01)

(58) Field of Classification Search
CPC ....... G11C 7/1051; G11C 7/22; G11C 7/1072; G11C 7/1006; G11C 7/1066
USPC ....... 365/189.15, 189.14, 193, 189.02, 233.1
See application file for complete search history.

(56) References Cited

U.S. PATENT DOCUMENTS

| | | | |
|---|---|---|---|
| 9,459,962 B2 * | 10/2016 | Yang | G06F 11/108 |
| 9,570,130 B2 | 2/2017 | Yu et al. | |
| 2015/0089164 A1 * | 3/2015 | Ware | G11C 5/02 |
| | | | 711/149 |

OTHER PUBLICATIONS

"Memory Access Interface Device", U.S. Appl. No. 16/408,873, filed May 10, 2019.
"DDR SDRAM physical layer interface circuit and DDR SDRAM control device", U.S. Appl. No. 16/182,680, filed Nov. 7, 2018.

\* cited by examiner

*Primary Examiner* — Son T Dinh
(74) *Attorney, Agent, or Firm* — WPAT, PC

(57) ABSTRACT

The present disclosure discloses a memory access interface device. A clock generation circuit generates a command reference clock signal. Each of the access signal transmission circuits adjusts a phase and a duty cycle of one of access signals from a memory access controller according to the command reference clock signal to generate one of output access signal including an output external read enable signal to activate a memory device and an output internal read enable signal. The data reading circuit samples a data signal from the activated memory device according to a sampling signal to generate and transmit a read data signal to the memory access controller. The multiplexer generates the sampling signal according to the output internal read enable signal under a SDR mode and generates the sampling signal according to a data strobe signal from the activated memory device under a DDR mode.

16 Claims, 3 Drawing Sheets

US 10,998,061 B1

MEMORY SYSTEM AND MEMORY ACCESS INTERFACE DEVICE THEREOF

BACKGROUND OF THE INVENTION

1. Field of the Invention

The present disclosure relates to a memory system and a memory access interface device thereof.

2. Description of Related Art

The configuration of single data rate (SDR) having a low speed is used in the early development of NAND flash memory technology. However, due to the increasing requirement of the bandwidth of the products, the conventional configuration of single data rate cannot fulfill the requirement of the speed. As a result, the configuration of non-volatile double data rate (NVDDR) is proposed to break the speed limit.

The specifications of NVDDR having higher and higher speed are further proposed under such a configuration. However, the memory controllers on the market are requested to support all the modes having different speeds and the ability of signal calibration.

SUMMARY OF THE INVENTION

In consideration of the problem of the prior art, an object of the present disclosure is to provide a memory system and a memory access interface device thereof.

The present disclosure discloses a memory access interface device that includes a clock generation circuit, a plurality of access signal transmission circuits, a data reading circuit and a multiplexer. The clock generation circuit is configured for generating a command reference clock signal. Each of the access signal transmission circuits is configured for adjusting a phase and a duty cycle of one of a plurality of access signals from a memory access controller according to the command reference clock signal to generate one of a plurality of output access signals, wherein the access signals comprise an external read enable signal and an internal read enable signal, and the output access signals comprise an output external read enable signal to activate a memory device and an output internal read enable signal. The data reading circuit is configured for sampling a data signal from the activated memory device according to a sampling signal to generate and transmit a read data signal to the memory access controller. The multiplexer is configured for generating the sampling signal according to the output internal read enable signal under a single data rate (SDR) mode and generating the sampling signal according to a data strobe signal from the activated memory device under a double data rate (DDR) mode.

The present disclosure also discloses a memory system that includes a memory access controller, a memory device and a memory access interface device. The memory access interface device includes a clock generation circuit, a plurality of access signal transmission circuits, a data reading circuit and a multiplexer. The clock generation circuit is configured for generating a command reference clock signal. Each of the access signal transmission circuits is configured for adjusting a phase and a duty cycle of one of a plurality of access signals from the memory access controller according to the command reference clock signal to generate one of a plurality of output access signals, wherein the access signals comprise an external read enable signal and an internal read enable signal, and the output access signals comprise an output external read enable signal to activate the memory device and an output internal read enable signal. The data reading circuit is configured for sampling a data signal from the activated memory device according to a sampling signal to generate and transmit a read data signal to the memory access controller. The multiplexer is configured for generating the sampling signal according to the output internal read enable signal under a SDR mode and generating the sampling signal according to a data strobe signal from the activated memory device under a DDR mode.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a memory system and a memory access interface device thereof.

Figure 1:
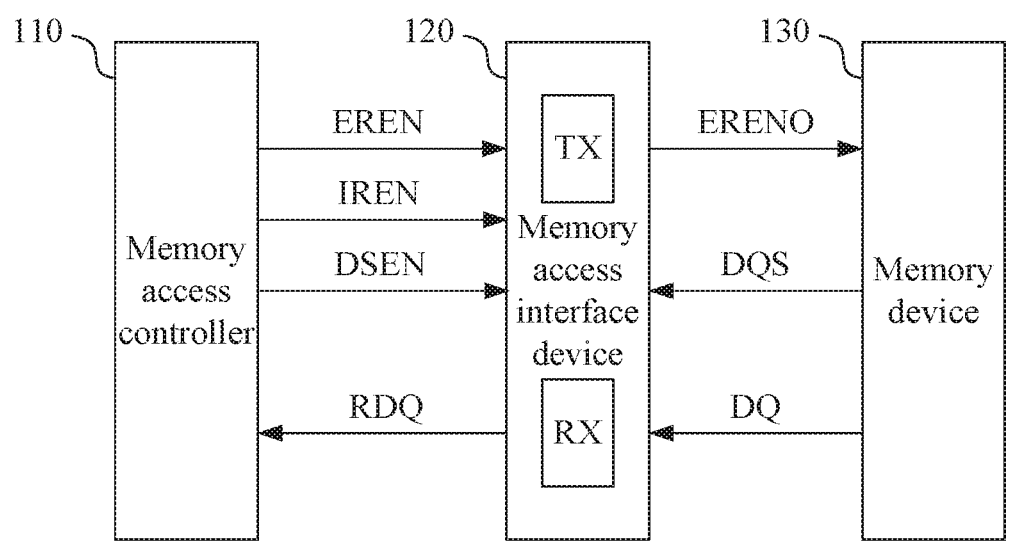
FIG. 1 illustrates a block diagram of a memory system according to an embodiment of the present invention.

Reference is now made to FIG. 1. FIG. 1 illustrates a block diagram of a memory system 100 according to an embodiment of the present invention. The memory system 100 includes a memory access controller 110, a memory access interface device 120 and a memory device 130.

The memory system 100 can be electrically coupled to other modules through such as, but not limited to a system bus (not illustrated). For example, the memory system 100 can be electrically coupled to a processor (not illustrated) through a system bus such that the processor can access the memory system 100.

In an embodiment, the memory access interface device 120 can be such as, but not limited to a physical layer circuit.

The memory device 130 is preferably a NAND flash memory that supports from the single data rate (SDR) mode having a relative lower speed to the double data rate (DDR) mode, e.g. NVDDR1, NVDDR2 or NVDDR3, having a relative higher speed.

External access signals, e.g. the access signals from the processor, can be received by the memory access controller 110 first and can be transmitted to the memory access interface device 120. Further, the access signals can be either transmitted from the memory access interface device 120 to the memory device 130 or used as a reference within the memory access interface device 120 to access the memory device 130.

More specifically, in an embodiment, the memory access controller 110 can receive and transmit the access signals including such as, but not limited to an external read enable signal EREN, an internal read enable signal IREN and a data strobe enable signal DSEN.

According to the signals described above, the memory access interface device 120 can activate the memory device 130, receive the data signal DQ from the activated memory device 130 and sample the data signal DQ to generate a read data signal RDQ to the memory access controller 110.

As a result, the internal data of the memory device 130 can thus be accessed according to the correct timing of the signals described above.

The memory access interface device 120 substantially includes a receiver RX and a transmitter TX. The configuration and the operation of the transmitter RX are described in detail in the following paragraphs.

Figure 2:
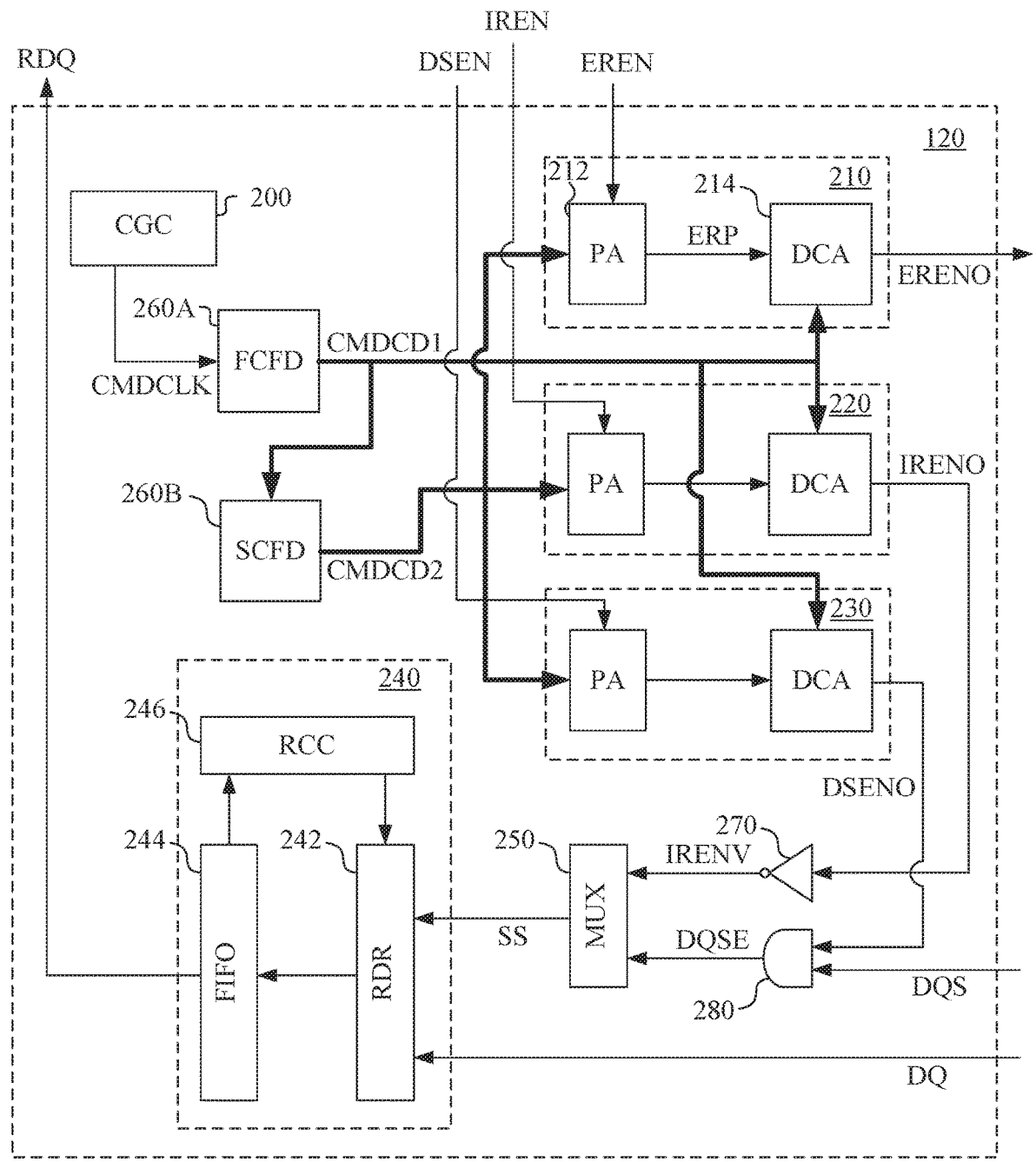
FIG. 2 illustrates a detailed block diagram of the memory access interface device in FIG. 1 according to an embodiment of the present invention.

Reference is now made to FIG. 2 at the same time. FIG. 2 illustrates a detailed block diagram of the memory access interface device 120 in FIG. 1 according to an embodiment of the present invention. It is appreciated that only the receiver RX of the memory access interface device 120 is illustrated in FIG. 2 without illustrating the transmitter TX.

The memory access interface device 120 includes a clock generation circuit 200 (abbreviated as CGC in FIG. 2), a plurality of access signal transmission circuits 210-230, a data reading circuit 240 and a multiplexer 250 (abbreviated as MUX in FIG. 2).

The clock generation circuit 200 is configured for generating a command reference clock signal CMDCLK.

In an embodiment, the memory access interface device 120 further includes a first clock frequency division circuit 260A (abbreviated as FCFD in FIG. 2) and a second clock frequency division circuit 260B (abbreviated as SCFD in FIG. 2). The first clock frequency division circuit 260A is configured for dividing a frequency of the command reference clock signal CMDCLK to generate a first divided clock signal CMDCD1. The second clock frequency division circuit 260B is configured for dividing a frequency of the first divided clock signal CMDCD1 to generate a second divided clock signal CMDCD2.

Each of the access signal transmission circuits 210-230 adjusts a phase of one of the access signals according to the second divided clock signal CMDCD2 and adjusts a duty cycle of one of the access signals according to the first divided clock signal CMDCD1.

The access signal transmission circuits 210-230 include an external read enable signal transmission circuit 210, an internal read enable signal transmission circuit 220 and a data strobe enable signal transmission circuit 230.

Take the external read enable signal transmission circuit 210 as an example, the external read enable signal transmission circuit 210 includes a phase adjusting circuit 212 (abbreviated as PA in FIG. 2) and a duty cycle adjusting circuit 214 (abbreviated as DCA in FIG. 2).

The phase adjusting circuit 212 is configured for receiving the external read enable signal EREN from the memory access controller 110 to adjust the phase of the external read enable signal EREN according to the second divided clock signal CMDCD2 to generate a phase-adjusted access signal ERP.

In an embodiment, the phase adjusting circuit 212 may include at least one flip-flop to sample the external read enable signal EREN according to the phase of the second divided clock signal CMDCD2 to accomplish the phase-adjusting mechanism.

In an embodiment, when a rising edge of the second divided clock signal CMDCD2 is within a set-up and hold time of a waveform of the external read enable signal EREN, a timing violation issue is easy to occur since the set-up and hold time is the transition time of the waveform of the external read enable signal EREN turning from a low state to a high state.

As a result, in an embodiment, the phase adjusting circuit 212 can adjust the phase of the external read enable signal EREN according to a sample result of the rising edge and a falling edge of the second divided clock signal CMDCD2. In an embodiment, when the signal transmission is not sampled by the rising edge of the second divided clock signal CMDCD2 and the signal transmission is sampled by the falling edge of the second divided clock signal CMDCD2, the phase adjusting circuit 212 can adjust the phase of the external read enable signal EREN according to such as, but not limited to the falling edge of the second divided clock signal CMDCD2.

It is appreciated that the configuration of the phase adjusting circuit 212 described above is merely an example. In other embodiments, the configuration of the phase adjusting circuit 212 can be different.

The duty cycle adjusting circuit 214 is configured for adjusting a duty cycle of the phase-adjusted access signal ERP according to the first divided clock signal CMDCD1 to generate and transmit the external read enable signal ERENO to the memory device 130. The memory device 130 is thus activated by the external read enable signal ERENO to transmit the data signal DQ to the memory access interface device 120.

In order to support the DDR mode that samples the data according to the rising edge and the falling edge at the same time, the duty cycle adjusting circuit 214 can operate according to the first divided clock signal CMDCD1 which having a higher speed. The duty cycle adjusting circuit 214 is used to fine tune the duty cycle of the phase-adjusted access signal ERP to become 50-50, which is the half of a time period. The adjusted result is outputted as the external read enable signal ERENO. It is appreciated that in practical implementation, the duty cycle may be deviated from the exact half of a time period by a reasonable difference due to the error caused by the components.

On the other hand, the internal read enable signal transmission circuit 220 receives the internal read enable signal IREN and adjusts a phase and a duty cycle of the internal read enable signal IREN to generate an output internal read enable signal IRENO.

Further, the data strobe enable signal transmission circuit 230 receives the data strobe enable signal DSEN and adjusts a phase and a duty cycle of the data strobe enable signal DSEN to generate an output data strobe enable signal DSENO.

In an embodiment, each of the internal read enable signal transmission circuit 220 and the data strobe enable signal transmission circuit 230 includes components and operation mechanism identical to those of the external read enable signal transmission circuit 210. As a result, no further detail is described herein.

The data reading circuit 240 is configured for sampling the data signal DQ from the activated memory device 130 according to a sampling signal SS to generate and transmit a read data signal RDQ to the memory access controller 110.

The multiplexer 250 is configured for generating the sampling signal SS according to at least one of the signals from the access signal transmission circuits 210-230 and the activated memory device 130 under different operation modes, i.e. the SDR mode and the DDR mode.

Figure 3A:
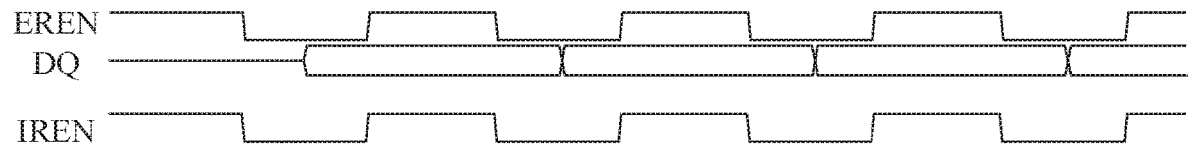
FIG. 3A to FIG. 3C illustrate the waveforms of various signals related to the operation of the memory access interface device under the SDR mode according to an embodiment of the present invention.
Figure 3B:
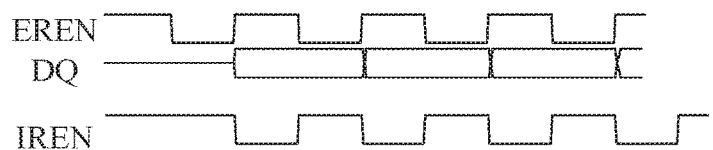
Figure 3C:
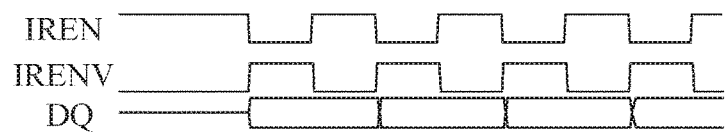

Reference is now made to FIG. 3A, FIG. 3B and FIG. 3C at the same time. FIG. 3A to FIG. 3C illustrate the waveforms of various signals related to the operation of the memory access interface device 120 under the SDR mode according to an embodiment of the present invention.

More specifically, in FIG. 3A and FIG. 3B, the waveforms of the external read enable signal EREN, the internal read enable signal IREN and the data signal DQ are illustrated. In FIG. 3C, the internal read enable signal IREN, an inverted output internal read enable signal IRENV and the data signal DQ are illustrated.

The operation of the memory access interface device 120 in the SDR mode is further described in the following paragraphs.

Under the SDR mode, the external read enable signal transmission circuit 210 receives the external read enable signal EREN and generates the external read enable signal ERENO to activate the memory device 130, in which the external read enable signal ERENO acts as a clock signal to provide a strobe function. The memory device 130 thus transmits the data signal DQ to the memory access interface device 120.

At the same time, the internal read enable signal transmission circuit 220 receives the internal read enable signal IREN and generates the output internal read enable signal IRENO. In an embodiment, the internal read enable signal IREN and the external read enable signal EREN have the same operation frequency.

In an embodiment, under the SDR mode, the memory device 130 can operate in a first speed operation state, in which the first speed operation state corresponds to the operation frequency lower than a predetermined value. In a numerical example, the first speed operation state may correspond to the operation frequency of 10 megahertz (MHz).

Under such a condition, since the speed is slow, the total time of the transmission of the external read enable signal ERENO, the activation of the memory device 130 and the transmission of the data signal DQ can be within a half of a time period of the external read enable signal EREN, as illustrated in FIG. 3A.

As a result, the phases of the internal read enable signal IREN and the external read enable signal EREN from the memory access controller 110 are synchronized in the first speed operation state under the SDR mode, as illustrated in FIG. 3A. The internal read enable signal transmission circuit 220 generates the output internal read enable signal IRENO accordingly.

On the other hand, under the SDR mode, the memory device 130 can operate in a second speed operation state, in which the second speed operation state corresponds to the operation frequency not lower than the predetermined value. In a numerical example, the second speed operation state may correspond to the operation frequency of 33 MHz.

Under such a condition, the speed is high such that the total time of the transmission of the external read enable signal ERENO, the activation of the memory device 130 and the transmission of the data signal DQ may exceed the half of the time period of the external read enable signal EREN, as illustrated in FIG. 3B.

As a result, in order to compensate for the transmission time of the signal under the high speed state, the phase of the internal read enable signal IREN is behind the phase of the external read enable signal EREN by a half of the time period in the second speed operation state under the SDR mode, as illustrated in FIG. 3B. The internal read enable signal transmission circuit 220 generates the output internal read enable signal IRENO accordingly.

In an embodiment, the memory access interface device 120 further includes an inverter 270. The inverter 270 is configured for receiving the output internal read enable signal IRENO to output the inverted output internal read enable signal IRENV, as illustrated in FIG. 3C.

Subsequently, the multiplexer 250 selects the inverted output internal read enable signal IRENV as the sampling signal SS such that the data reading circuit 240 samples the data signal DQ accordingly.

In an embodiment, under the SDR mode, the data reading circuit 240 samples the data signal DQ according to one of two edges of every sampling period of the sampling signal SS to generate the read data signal RDQ. In an embodiment, the edge of the sampling signal SS used to sample the data signal DQ is the falling edge, e.g. the falling edge illustrated in FIG. 3C.

In another embodiment, under the SDR mode, the data reading circuit 240 samples the data signal DQ according to both of the two edges of the sampling signal SS, i.e. both the rising edge and the falling edge. Further, the data reading circuit 240 discards the sampling results generated according to one of the two edges of the sampling signal SS (e.g. the rising edge) to generate the read data signal RDQ.

Figure 4:
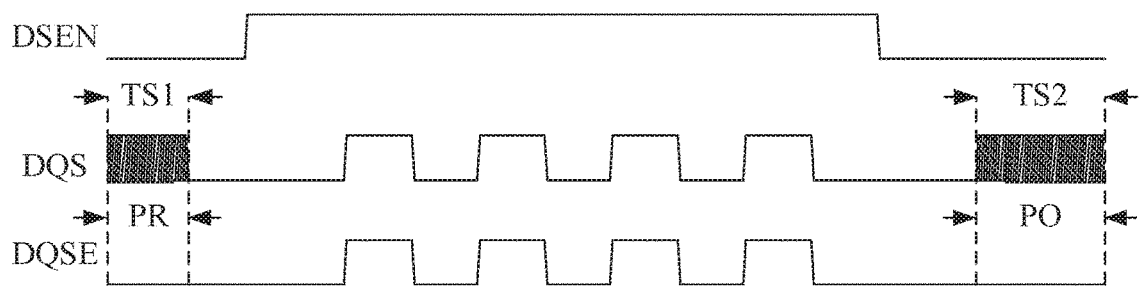
FIG. 4 illustrates the waveforms of various signals related to the operation of the memory access interface device under the DDR mode according to an embodiment of the present invention.

Reference is now made to FIG. 4. FIG. 4 illustrates the waveforms of various signals related to the operation of the memory access interface device 120 under the DDR mode according to an embodiment of the present invention.

More specifically, in FIG. 4, the data strobe enable signal DSEN, the data strobe signal DQS and an enabled data strobe signal DQSE are illustrated.

The operation of the memory access interface device 120 in the DDR mode is further described in the following paragraphs.

Under the DDR mode, the external read enable signal transmission circuit 210 receives the external read enable signal EREN and generates the external read enable signal ERENO to activate the memory device 130. The memory device 130 thus not only transmits the data signal DQ, but also transmits a data strobe signal DQS to the memory access interface device 120.

At the same time, the data strobe enable signal transmission circuit 230 receives the data strobe enable signal DSEN and generates the output data strobe enable signal DSENO.

In an embodiment, the memory access interface device 120 further includes an enabling circuit 280 configured for receiving the output data strobe enable signal DSENO and the data strobe signal DQS. The memory access interface device 120 is further enabled by the output data strobe enable signal DSENO to output the enabled data strobe signal DQSE.

In an embodiment, the enabling circuit 280 is implemented by using an AND logic gate.

As illustrated in FIG. 4, the data strobe signal DQS may include tri-state sections TS1 and TS2. By using the output data strobe enable signal DSENO to enable the enabling circuit 280, a clean preamble section PR and a clean postamble section PO, respectively corresponding to the tri-state sections TS1 and TS2, can be generated in the enabled data strobe signal DQSE. The instability of the signal drifting generated due to the variation of manufacturing process, voltage and temperature can be avoided.

Subsequently, the multiplexer 250 selects the enabled data strobe signal DQSE as the sampling signal SS under the DDR mode such that the data reading circuit 240 samples the data signal DQ accordingly. Since the DDR mode is operated, the data reading circuit 240 samples the data signal DQ by using both edges of the data strobe signal DQSE.

It is appreciated that in the configuration described above, the use of inverter 270 generating the inverted output internal read enable signal IRENV having edges relative to the data signal DQ in the SDR mode similar to the edges of the data strobe signal DQS relative to the data signal DQ in the DDR mode. As a result, the data reading circuit 240 is able to perform data sampling in the SDR mode and the DDR mode by using the same circuit configuration.

In an embodiment, the data reading circuit 240 may include a read data receiver circuit 242 (abbreviated as RDR in FIG. 2), a read data first-in-first-out (FIFO) circuit 244 (abbreviated as FIFO in FIG. 2) and a read calibration circuit 246 (abbreviated as RCC in FIG. 2) that operate according to such as, but not limited to the second divided clock signal CMDCD2.

The read data receiver circuit 242 is configured for sampling the data signal DQ according to the sampling signal SS. The read data FIFO circuit 244 is configured for performing clock domain conversion on the data sampled by the read data receiver circuit 242 to generate the read data signal RDQ.

In an embodiment, the clock domain conversion is used to convert the data in the clock domains between the read data receiver circuit 242 and the memory access controller 110.

The read calibration circuit 246 is configured for performing calculation on the data stored by the read data FIFO circuit 244 based on a predetermined calibration algorithm, and generating a feedback calibration signal (not labeled) to the read data receiver circuit 242.

It is appreciated that the embodiments described above are merely an example. In other embodiments, it should be appreciated that many modifications and changes may be made by those of ordinary skill in the art without departing, from the spirit of the invention.

In summary, the memory system and the memory access interface device thereof of the present invention can provide the reference signals under either SDR mode or DDR mode to adjusting the timing of the access signals to access the memory device with adjustable and accurate timing with a low cost.

The aforementioned descriptions represent merely the preferred embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A memory access interface device comprising:
a clock generation circuit configured for generating a command reference clock signal;
a plurality of access signal transmission circuits each configured for adjusting a phase and a duty cycle of one of a plurality of access signals from a memory access controller according to the command reference clock signal to generate one of a plurality of output access signals, wherein the access signals comprise an external read enable signal and an internal read enable signal, and the output access signals comprise an output external read enable signal to activate a memory device and an output internal read enable signal;
a data reading circuit configured for sampling a data signal from the activated memory device according to a sampling signal to generate and transmit a read data signal to the memory access controller; and
a multiplexer configured for generating the sampling signal according to the output internal read enable signal under a single data rate (SDR) mode and generating the sampling signal according to a data strobe signal from the activated memory device under a double data rate (DDR) mode.

2. The memory access interface device of claim 1, further comprising:
a first clock frequency division circuit configured for dividing a frequency of the command reference clock signal to generate a first divided clock signal; and
a second clock frequency division circuit configured for dividing a frequency of the first divided clock signal to generate a second divided clock signal;
wherein the access signal transmission circuits adjust the phase of the access signals according to the second divided clock signal and adjust the duty cycle of the access signals according to the first divided clock signal.

3. The memory access interface device of claim 2, wherein each of the access signal transmission circuits further comprises:
a phase adjusting circuit configured for receiving the corresponding one of the access signals from the memory access controller to adjust the phase thereof according to the second divided clock signal to generate a phase-adjusted access signal; and
a duty cycle adjusting circuit configured for adjusting a duty cycle of the phase-adjusted access signal according to the first divided clock signal to generate the corresponding one of the output access signals.

4. The memory access interface device of claim 1, wherein the access signals further comprise a data strobe enable signal, and the output access signals comprise further comprise an output data strobe enable signal;
wherein the memory access interface device further comprises an enabling circuit configured for receiving the output data strobe enable signal and the data strobe signal, and being enabled by the output data strobe enable signal to output an enabled data strobe signal such that the multiplexer selects the enabled data strobe signal as the sampling signal under the DDR mode.

5. The memory access interface device of claim 1, further comprising an inverter configured for receiving the output internal read enable signal to output an inverted output internal read enable signal such that the multiplexer selects the inverted output internal read enable signal as the sampling signal under the SDR mode.

6. The memory access interface device of claim 1, wherein the internal read enable signal and the external read enable signal have a same operation frequency;
phases of the internal read enable signal and the external read enable signal are synchronized in a first speed operation state under the SDR mode;
the phase of the internal read enable signal is behind the phase of the external read enable signal by a half of a time period of the external read enable signal in a second speed operation state under the SDR mode;
wherein the first speed operation state corresponds to the operation frequency lower than a predetermined value, and the second speed operation state corresponds to the operation frequency not lower than the predetermined value.

7. The memory access interface device of claim 1, wherein under the SDR mode, the data reading circuit is configured for sampling the data signal either according to one of two edges of every sampling period of the sampling signal to generate the read data signal, or according to both of the two edges of the sampling signal and discarding a plurality of sampling results generated according to one of the two edges of the sampling signal to generate the read data signal.

8. The memory access interface device of claim 1, wherein the memory device is a NAND flash memory operated in the SDR mode or the DDR mode.

9. A memory system comprising:
a memory access controller;
a memory device; and
a memory access interface device comprising:
a clock generation circuit configured for generating a command reference clock signal;
a plurality of access signal transmission circuits each configured for adjusting a phase and a duty cycle of one of a plurality of access signals from the memory access controller according to the command reference clock signal to generate one of a plurality of output access signals, wherein the access signals comprise an external read enable signal and an internal read enable signal, and the output access signals comprise an output external read enable signal to activate the memory device and an output internal read enable signal;
a data reading circuit configured for sampling a data signal from the activated memory device according to a sampling signal to generate and transmit a read data signal to the memory access controller; and
a multiplexer configured for generating the sampling signal according to the output internal read enable signal under a SDR mode and generating the sampling signal according to a data strobe signal from the activated memory device under a DDR mode.

10. The memory system of claim 9, wherein the memory access interface device further comprises:
a first clock frequency division circuit configured for dividing a frequency of the command reference clock signal to generate a first divided clock signal; and
a second clock frequency division circuit configured for dividing a frequency of the first divided clock signal to generate a second divided clock signal;
wherein the access signal transmission circuits adjust the phase of the access signals according to the second divided clock signal and adjust the duty cycle of the access signals according to the first divided clock signal.

11. The memory system of claim 10, wherein each of the access signal transmission circuits further comprises:
a phase adjusting circuit configured for receiving the corresponding one of the access signals from the memory access controller to adjust the phase thereof according to the second divided clock signal to generate a phase-adjusted access signal; and
a duty cycle adjusting circuit configured for adjusting a duty cycle of the phase-adjusted access signal according to the first divided clock signal to generate the corresponding one of the output access signals.

12. The memory system of claim 9, wherein the access signals further comprise a data strobe enable signal, and the output access signals comprise further comprise an output data strobe signal;
wherein the memory access interface device further comprises an enabling circuit configured for receiving the output data strobe enable signal and the data strobe signal, and being enabled by the output data strobe enable signal to output an enabled data strobe signal such that the multiplexer selects the enabled data strobe signal as the sampling signal under the DDR mode.

13. The memory system of claim 9, wherein the memory access interface device further comprises an inverter configured for receiving the output internal read enable signal to output an inverted output internal read enable signal such that the multiplexer selects the inverted output internal read enable signal as the sampling signal under the SDR mode.

14. The memory system of claim 9, wherein the internal read enable signal and the external read enable signal have a same operation frequency;
phases of the internal read enable signal and the external read enable signal are synchronized in a first speed operation state under the SDR mode;
the phase of the internal read enable signal is behind the phase of the external read enable signal by a half of a time period of the external read enable signal in a second speed operation state under the SDR mode;
wherein the first speed operation state corresponds to the operation frequency lower than a predetermined value, and the second speed operation state corresponds to the operation frequency not lower than the predetermined value.

15. The memory system of claim 9, wherein under the SDR mode, the data reading circuit is configured for sampling the data signal either according to one of two edges of the sampling signal to generate the read data signal, or according to both of the two edges of the sampling signal and discarding a plurality of sampling results generated according to one of the two edges of the sampling signal to generate the read data signal.

16. The memory system of claim 9, wherein the memory device is a NAND flash memory operated in the SDR mode or the DDR mode.

* * * * *